United States Patent [19]

Simon et al.

[11] 4,053,977
[45] Oct. 18, 1977

[54] METHOD FOR ETCHING THIN FOILS BY ELECTROCHEMICAL MACHINING TO PRODUCE ELECTRICAL RESISTANCE ELEMENTS

[75] Inventors: Paul René Simon; Bernard LeGrives, both of Nice, France

[73] Assignee: Societe Francaise de l'Electro-Resistance, Nice Cedex, France

[21] Appl. No.: 679,929

[22] Filed: Apr. 26, 1976

[30] Foreign Application Priority Data

Mar. 18, 1976 France .................. 76.07889

[51] Int. Cl.$^2$ ............................................. H01C 17/06
[52] U.S. Cl. ..................................... 29/620; 29/610 R
[58] Field of Search ............... 29/610 R, 610 SG, 620

[56] References Cited

U.S. PATENT DOCUMENTS

| | | | |
|---|---|---|---|
| 2,885,524 | 5/1959 | Eisler | 29/611 |
| 3,174,920 | 3/1965 | Post | 204/129.55 |
| 3,405,381 | 10/1968 | Zandman et al. | 338/254 |
| 3,434,206 | 3/1969 | Umantsev | 29/610 |
| 3,517,436 | 6/1970 | Zandman et al. | 29/613 |
| 3,534,467 | 10/1970 | Sachs et al. | 29/583 |

*Primary Examiner* — F. Edmundson
*Attorney, Agent, or Firm* — Lane, Aitken, Dunner & Ziems

[57] ABSTRACT

A process for etching a thin film or foil of an electrically conductive resistive material, preferably an alloy predominantly comprising nickel and chromium, by electrolytic etching under conditions of electrochemical machining above Jacquet's plateau on the I.V. characteristic curve. The process is particularly suitable for manufacturing a planar electrical resistor having a high stability, a low temperature coefficient, and a high ohmic value despite the relatively low resistivity of the film or foil. The anode surface polarization is maintained substantially constant over the surface of the foil or film by removing the by-products of the etching process, i.e., gases, viscous layers and other impurities, by mechanical effects such as an electrolytic flow or mechanical vibration, or both together. These mechanical effects are carefully balanced against the applied potential values such that the rate of formation of the layers and gases at the anode is equal to their rate of removal. Moreover, the anode electrical resistance is kept at a negligible value independent of the progress of the attack, by securing the film or foil to a thick layer of a conductor such as copper, whereby the evolution of potential drop across the foil, due to the electrical current flow, is kept at a negligibly small level. Under these conditions, a quasi-uniform etching is obtained all over the foil or film surface. The operating parameters of the process are also described as well as the advantages of the resistor produced according to the process of the invention.

13 Claims, 10 Drawing Figures

METHOD FOR ETCHING THIN FOILS BY ELECTROCHEMICAL MACHINING TO PRODUCE ELECTRICAL RESISTANCE ELEMENTS

BACKGROUND OF THE INVENTION

This invention relates to a process for etching a thin film or foil by electrochemical machining where preferably the foil is an electrically conductive resistive alloy predominantly comprising nickel and chromium. More particularly, this invention relates to a process for manufacturing a planar electrical resistor of the type wherein a thin metallic foil is photo-etched into a pattern of isolated windows and conductive filaments to increase the current path and total resistance value of the foil. Still more particularly, this invention relates to such a process in which the foil is etched from a bonded substrate under conditions of electrochemical machining above Jacquet's plateau on the I–V characteristic curve while maintaining the anode polarization substantially constant over the foil surface to be etched at a value which, for a given flow rate and velocity of electrolyte, or a given amplitude level and frequency of the mechanically vibrated anode, is such that the rate of formation of a viscous layer and oxygen is equal to their rate of removal.

In the prior art, the manufacture of planar electrical resistors is usually accomplished by photo-etching a thin metallic foil into a pattern of isolated windows and conductive filaments in such a way that the current path through the etched foil is significantly increased and the total resistance value of the foil is multiplied accordingly. In the prior art, these resistors may be made with a foil or thin film of a suitable conductive foil, such as one predominantly comprising nickel and chromium, deposited on an isolated substrate and photo-etched with an appropriate acid or, more specifically, with an electrolytic polishing process used in conjunction with an insulating mask. The purpose of this type of etching operation is to form a grid of the conductive foil comprising the largest possible number of conductive filaments for a given surface area, since the resistance final value of the resistor is proportional to the number of filaments and the length-to-width ratio of the filaments.

In practice, the application of the aforementioned techniques is quite difficult and accompanied by a number of significant technical problems. In effect, the use of chemical etching is not entirely satisfactory because of the raggedness and irregularities of the edges of the filament in the grid. Such raggedness or irregularities in the edge contour of the filament significantly and detrimentally affect the subsequent stability of the resistor because of the electric field gradients introduced by these defects if the filaments are too closely adjacent to one another. Consequently, this process of chemical etching is limited to the manufacture of resistors having a relatively low ohmic value wherein the conductive filaments are too narrow or too close to each other. This limited value is typically of the order of 20 k$\Omega$/cm$^2$ with a foil having a 0.5 $\Omega/\square$ ohmic value.

U.S. Pat. No. 2,885,524 to Eisler and U.S. Pat. Nos. 3,405,381 and 3,517,436 to Zandman et al., describe the etching of a metallic film to a pattern which establishes a narrow conductive path of much greater total length than the dimensions of the face of a substrate. In the latter two patents, the etching is accomplished by covering the thin alloy film with a photo-sensitive masking medium. By means of photographic exposure and development, the medium is retained in contact with the surface of the film only in the desired resistor pattern and is removed from those portions where the alloy film is to be etched away. An etching process is thereafter used to remove the exposed portions of the thin alloy film.

The U.S. Pat. No. 3,174,920 to Post describes a method for producing an electrical resistance strain gauge by an electropolishing process used in conjunction with an insulating mask. In order to be electropolished, the foil to be etched is bonded to an insulated substrate and an insulated mask is used to define the areas to be etched away. The conditions of electropolishing are met when the current density at the foil surface is controlled by the formation at the surface of the foil of a viscous layer of oxides, which is a by-product of the electrolytic process. In order to reach the surface of the foil, the anions diffuse through the layer, thus producing in the current-voltage (I–V) characteristic curves a pattern where the current density is independent of the applied potential value between the anode and cathode.

The electropolishing conditions occur in the portion of the I–V characteristic curve where the current density is independent of the applied potential value, which characteristic is also called Jacquet's plateau. In this curve, however, a threshold level exists above which oxygen formation takes place at the anode surface, thus introducing discontinuities in the viscous layer at the foil surface. Then in this region above Jacquet's plateau the current density becomes progressively independent of the remains of viscous layers which stay on the surface, and increasingly dependent of the applied potential, as shown in FIG. 8.

As described by Post and others, electropolishing conditions are established by the development of a surface film on a workpiece and a viscous layer in the adjacent electrolyte. This film and layer, under these conditions, account for most of the electrical resistance near the workpiece and thus control the local current density in the workpiece.

Moreover, when an insulated mask is placed on the foil to be etched, the current density is probably smaller along the edges of the mask because it is insulated, and therefore the viscous layer is thinner in these areas. Thus, even when the anode-cathode potential is constant, the anode polarization conditions are different across the mask aperture, and a preferential attack, as described in the Post U.S. Pat. No. 3,174,920, takes place along these edges.

A feature of the Post method is to locate the adjacent regions of predominant electropolishing action in a partially or completely overlapped mode, leaving no island of material between them during etching. Under these conditions, windows in the mask and thus in the foil of only a few microns width can be obtained with an applied voltage of one to two volts and a current density of about 0.05 Amp/cm$^2$.

It is clear, however, that if the conditions of overlap of the zones of preferential attack are not met, islands of material will remain along the center of the windows having a large width where there is no overlapping of the thinner parts of the viscous layer. Once an island is fully formed, there is no conducting path to the region of the foil adjacent thereto, and the subsequent effect on the island in the electropolishing process is practically zero. In effect, the island is electrically discontinuous with the cell. Moreover, continued attack in the foil by the electropolishing process results in undercutting the foil beneath the mask, at the very least affecting the accuracy of the resistor thus formed. In addition, the results under electropolishing conditions are not homogeneous due to the increase of the resistance of the foil as seen by the return current to the newly formed conductive filaments.

The process of electrochemical machining is known to the art, particularly in machining tough alloys such as might be used in the gas turbine industry. However, the art has not effectively applied these electrochemical machining techniques to the etching of thin foils or films and, in particular, to the manufacture of precision resistors. Moreover, the conditions under which such techniques might be used to manufacture precision resistors have not been significantly explored in the resistor art.

Accordingly, it is a broad object of the present invention to provide a method for manufacturing a precision electrical resistor having a planar configuration, high stability, and a low temperature coefficient under heavy load which avoids the edge raggedness produced by chemical etching and the inability to produce, under reliable conditions, windows of any size with electrolytic polising.

It is another object of this invention to produce a resistor of the type described by using a method of electrochemical machining characterized in that the operating conditions are above Jacquet's plateau.

It is another object of this invention to produce a resistor which has a stability on the order of a few tens of ppm/year.

It is still another object of this invention to produce a resistor having a low temperature coefficient on the order of between 0 and 15 ppm.

It is still a further object of this invention to etch a thin film or foil of resistive material under electromachining conditions of etching where, for a given electrolyte and its flow velocity, or a given amplitude level and frequency of the mechanical vibrated anode, the applied potential between the anode and cathode is such that the rate of formation of the viscous layer and oxygen at the foil surface is equal to their rate of removal.

It is still another object of this invention to provide such a method as described while maintaining the electrical resistance of the foil at a negligible value independent of the progress of the attack, preferably by using a relatively thick layer of a conductor such as copper bonded thereto, whereby the evolution of potential drop across the foil, due to the electrical current flow, is kept at a negligibly small level.

These and other objects of the invention will become apparent from the written description of the invention, taken in conjunction with the accompanying drawings.

BRIEF SUMMARY OF THE INVENTION

The method of the invention is directed to overcoming the difficulties mentioned above. Specifically, it is an aim of the invention to avoid the edge raggedness in a foil or film of resistive material, which raggedness is produced by chemical etching and to provide the ability to produce under reliable conditions windows of any desired size with electrolytic polishing, by using a method of electrochemical machining characterized by the fact that the operating conditions are above Jacquet's plateau.

The operating characteristics of the electrochemical machining process for producing such a resistor are characterized by a number of operating characteristics which include the following operating parameters and distinguishing features. The potential applied between anode and cathode and the current density in the electrolytic cell are higher in the electrochemical machining process than in the electrolytic polishing process. Thus, the operating range in the electromachining process is located above Jacquet's plateau and is typically between 3 and 4.5 volts for a nichrome alloy under certain conditions. The current density is approximately 3 to 10 times higher in the case of electrochemical machining than in the case of electrolytic polishing. In the cell, the viscous layer and the oxygen in formation are continuously removed by a strong flow of electrolyte which is directed against the anode. The purpose of this flow is to avoid the conduction of viscous layer formation, where the current density is diffusion limited. It is also possible to obtain the same result by connecting the anode to a generator of mechanical vibrations.

It is a significant feature of the invention to maintain the anode polarization constant over the surface of the material to be etched, notwithstanding local differences in polarization. When a strong flow of electrolyte is directed toward the anode, or a generator of mechanical vibrations is connected to it, the mechanical effects thus produced enhance the removal of the gases and the remains of the viscous layer and other impurities, thus maintaining the surface in a constant depolarization condition.

As the process is presently understood, the optimum conditions are realized when, for a given value of flow rate and velocity of fluid on the anode, or given amplitude level, or both, the applied potential between the anode and the cathode is such that the rate of formation of a viscous layer and oxygen is equal to their rate of removal.

In practicing the process, in order to obtain the same electrical conditions on the entire anode surface, in terms of applied potential and current density, a thick layer of highly conductive metal, such as copper, is deposited on the back of the foil or thin film to be etched as mentioned above. The purpose of this metallic layer as described is to maintain the electric field as constant as possible at the anode surface when the attack goes through the foil and, to introduce a low resistance conducting path for the return current, thus keeping the applied emf constant everywhere and allowing a uniform attack all over the surface. In addition, under the conditions described, the current density at the anode surface is dependent on the electrical field value at closed points and its value is further increased by locating the anode as close as possible to the cathode.

Under these conditions, it is possible to obtain very fine grooves in a metallic foil in the range of about 2.5 to 5 microns thickness. A significant feature of the grooves and metallic foil produced according to the invention is that, wholly aside from the fact that the width of such grooves can vary from a few microns to tens of microns or even larger, the edges of the grooves are almost vertical and are smooth. The permissible width of the grooves does not depend and is not limited by a distance which is a function of any preferential etching due to a viscous layer.

The invention is suitable for the manufacture of planar resistors having a high stability and a relatively large ohmic value. Typically, with the foil having a resistance value of 0.5 $\Omega/\square$, it is possible to manufacture a resistor having dimensions of 5.4. × 5.4 mm and of 70

K ohmic value, or 240 KΩ/cm², with a temperature coefficient of ± 5 ppm and a stability of ± 20 ppm/yard with a load of 0.3W at 125° C ambient temperature.

DETAILED DESCRIPTION OF THE PREFERRED EMBODIMENT

Figure 1:
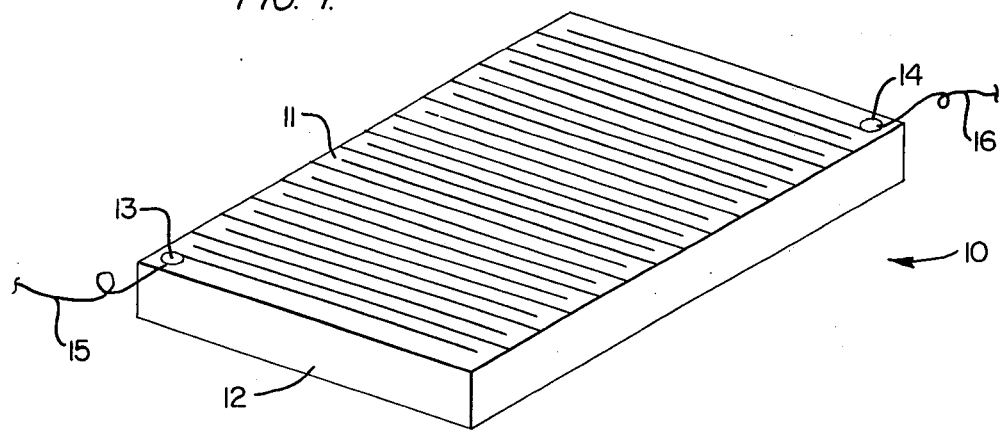
FIG. 1 shows an enlarged view, for illustrative purpose and not in detail, in perspective of a planar electrical resistor produced according to the process of the invention.

In FIG. 1, a typical resistor produced according to the invention is designated generally by the reference numeral 10. The resistor 10 is formed from a metal foil 11 by an electrochemical machining process. The foil 11 is secured to the substrate 12 and the resistor 10 includes a pair of connecting terminals 13 and 14 and a pair of accompanying electrical leads 15 and 16. Typically, a resistor according to the invention has dimensions of about 5.4 by 5.4 mm and a resistance value of about 240KΩ/cm² or larger with a foil of 0.5 Ω/□ resistance. The temperature coefficient of such a typical resistor produced according to the invention is about ± 5 parts per million and has a stability of ± 20 ppm/year with a load of 0.3W at 125° C ambient temperature.

Figure 2:
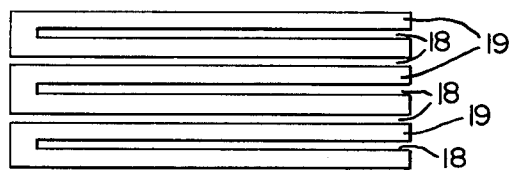
FIG. 2 shows a magnified view of a portion of the foil configuration produced by the method according to the invention.
Figure 3:
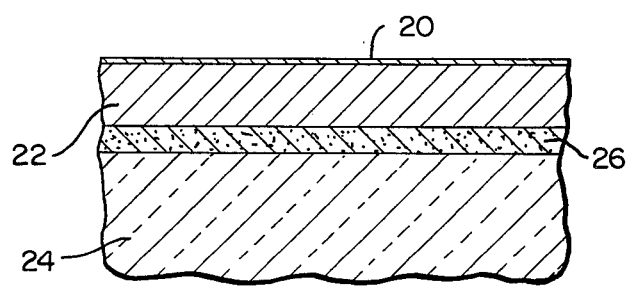
FIG. 3 is an enlarged partial cross-sectional view of the first intermediate assembly structure produced in the first intermediate step in the process, showing the unetched foil plated with a thick layer of copper and secured to a glass carrier substrate.

FIG. 2 is an enlarged view of the metal foil pattern in which foil has been removed from the area forming the slots 18 and leaving foil to form the conductive filament 19. The filaments 19 have smooth parallel edges free from irregularities and the raggedness that is characteristic of conventional chemical etching processes. The filaments 19 are also free from sharp notches. The smoothness of the filaments 19 formed by the electrochemical machining process of this invention permits a substantial decrease in the width of each filament 19 and a significant decrease in the slot width 18 so that the electrical resistance per unit filament length can increase in proportion to the decrease in width thus permitting a smaller overall length of the filament 19. However, according to the invention, the width of the slot 18 is not limited to a distance determined, at least in part, by the zones of preferential attack adjacent the filament 19.

FIGS. 3 through 6 are cross-sectional views of several intermediate steps in the manufacturing process. The resistor according to the invention is constructed of a thin metallic foil 20, on the order of 2.5 to 5.0 microns. The foil or thin film 20 may first be heat treated to adjust its temperature coefficient to a value suitable for further processing. Thereafter, the foil or thin film 20 preferably made from an alloy of nickel and chromium, is bonded to a relatively thick layer of copper 22, for example, 30 to 50 microns thick. One suitable method of bonding the foil to the copper, as is known in the art, is to plate the foil with the copper in a chemical bath. Thereafter, the copper and foil intermediate is glued to a glass substrate 24 by a conductive glue 26 with the foil surface 20 to be etched left exposed at the top thereof. The step of securing the copper to a glasss substrate by a conductive glue is within the skill of the art.

Figure 4:
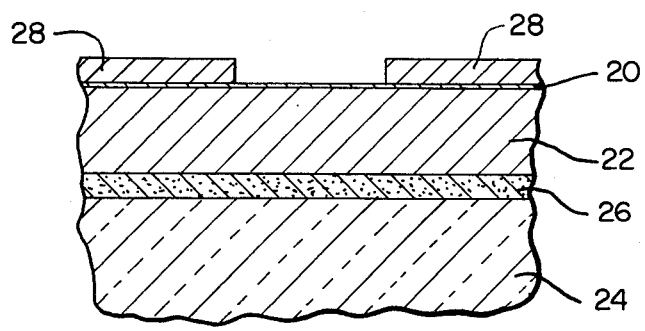
FIG. 4 is an enlarged partial cross-sectional view of the second intermediate assembly structure produced in the second intermediate step in the process, showing the photoresist masking material secured to the foil to define a representative window therein.

As diagrammatically shown in FIG. 4, the intermediate combination of the foil 20, copper 22, conductive glue 26, and glass substrate 24 have applied thereto an insulating mask 28 which provides a pattern for the grid as shown in part in FIG. 2. The technology of using insulating, photosensitive, or photoresist masks is well known in the semiconductor industry.

Figure 5:
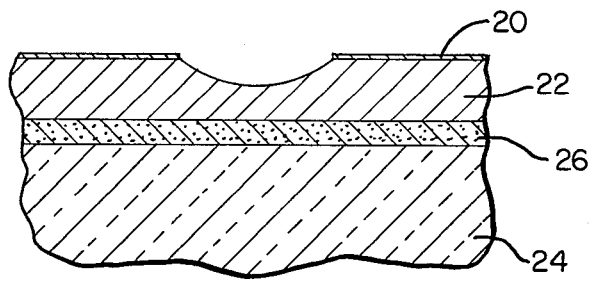
FIG. 5 is an enlarged partial cross-sectional view of the structure of FIG. 4 after the third intermediate step in the process, showing the foil and an portion of the copper as etched wherein the step of FIG. 5 is characterized as being conducted under electromachining conditions.

The assembly of FIG. 4 is then introduced into a special electrolytic bath in an electrolytic cell of suitable configuration and electrical connections are provided to the foil. FIG. 5 shows the foil and a portion of the copper layer etched away.

Figure 6:
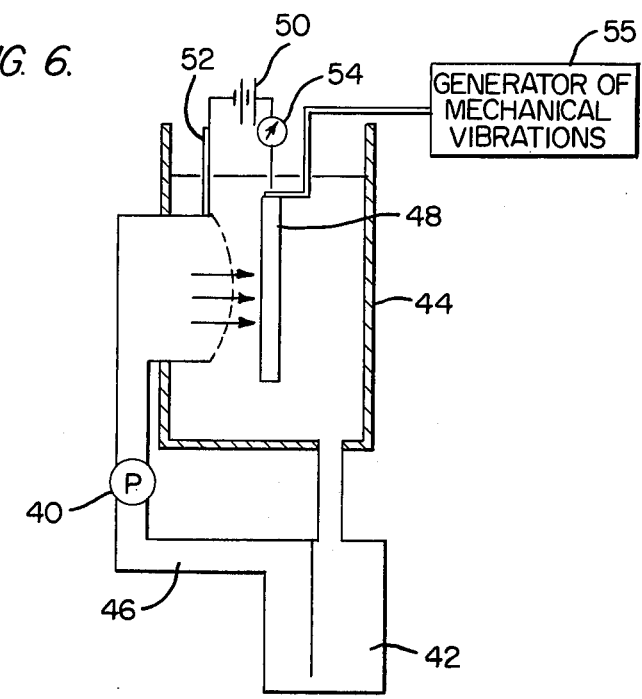
FIG. 6 is a diagrammatic illustration of the basic components of a representative electrolytic cell for etching the foil.

As shown in FIG. 6, a pump 40 provides electrolyte from a reservoir 42 to an etching zone 44 by a conduit 46. The foil 48 to be etched is the anode and is in circuit with a source of electrical potential 50. The negative terminal of the source of emf 50 is connected to a cathode 52, such as a stainless steel cathode, and an ammeter 54 may be in circuit with the source of emf 50. The pump 40 forces the electrolytic fluid to flow between the cathode and the anode preferably with a measured velocity of about 1 meter per second and at a flow rate of about 1 liter per second. It is also possible to connect a generator of mechanical vibrations to anode 42. The distance between the anode and the cathode is preferably set at about 5 mm. The optimum conditions of etching are realized when, for a given value of flow rate and velocity of fluid on the anode to be etched, or a given amplitude level for mechanical vibrations, or both, the applied potential between the anode and the cathode is such that the rate of formation of the viscous layer and the oxygen is equal to their rate of removal. In practice, this equilibrium has generally been found to be between about 3.5 and about 4.5 volts for a nickel-chromium alloy in a bath of orthophospheric acid and ethyl-alcohol in the proportion of 3:1.

Figure 7:
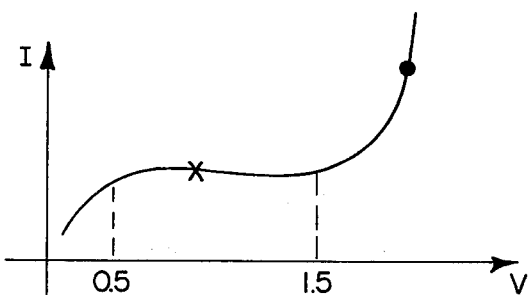
FIG. 7 is a simplified diagrammatic view of the I-V characteristic curve of the etching conditions in electrolytic etching and showing Jacquet's plateau.

FIG. 7 is a simplified diagrammatic graphical presentation of the etching characteristics for the cell of FIG. 6 plotting current versus voltage, where V is the potential between the anode and the cathode and I is the current. FIG. 7 shows a relatively flat area in the I-V characteristic curve called the Jacquet's plateau where the system behaves as an electropolishing cell. Under these conditions, a viscous layer appears on the surface plus a potential drop and, under these conditions, the sharp details of the surface are preferentially etched away. The current density of the anode is relatively small, on the order of 10 A/m$^2$ and V is typically between 0.5 and 1.5 volts. These conditions of operation are described in the Post U.S. Pat., No. 3,174,920, heretofore referred to.

Figure 8:
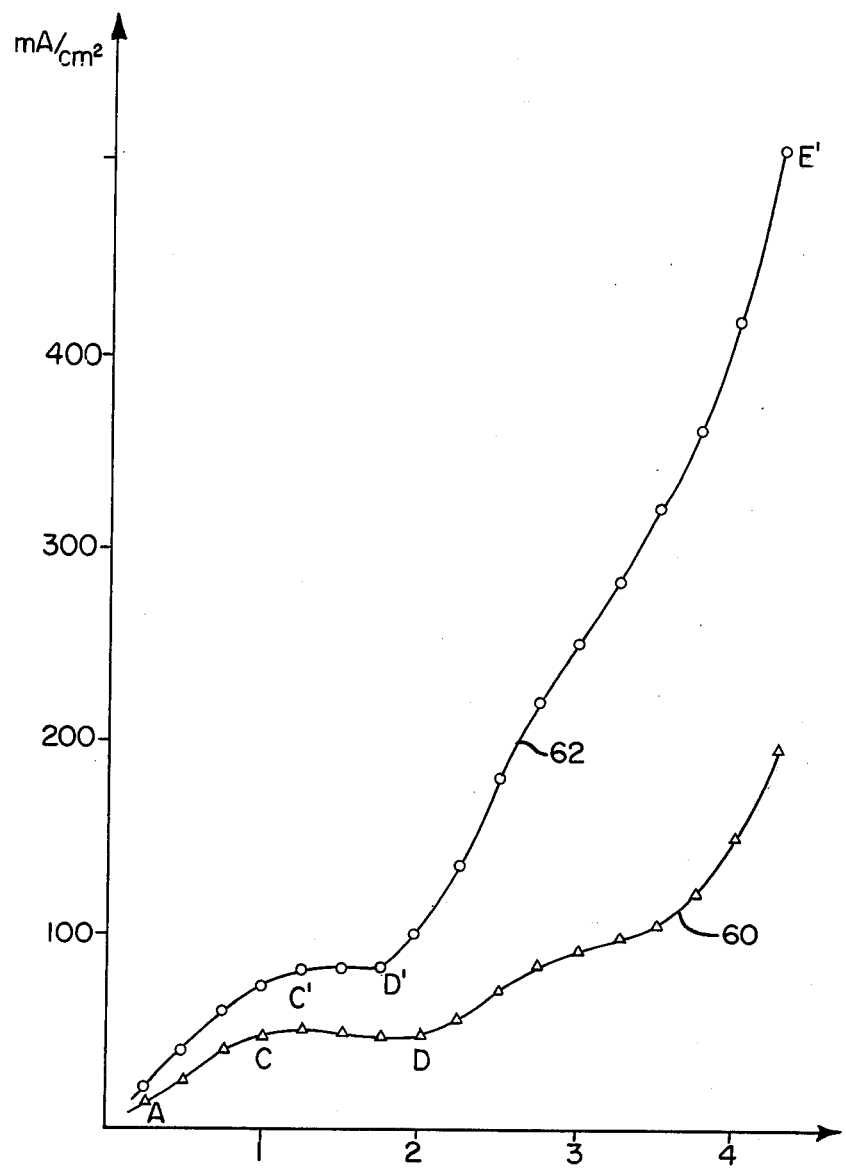
FIG. 8 shows the I-V characteristic curve for the operating conditions according to the invention.
Figure 9:
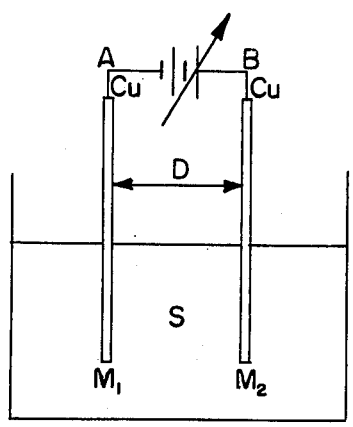
FIG. 9 is a simplified view of an electrolytic cell for use in describing the theory applicable to the curves of FIG. 8.
Figure 10:
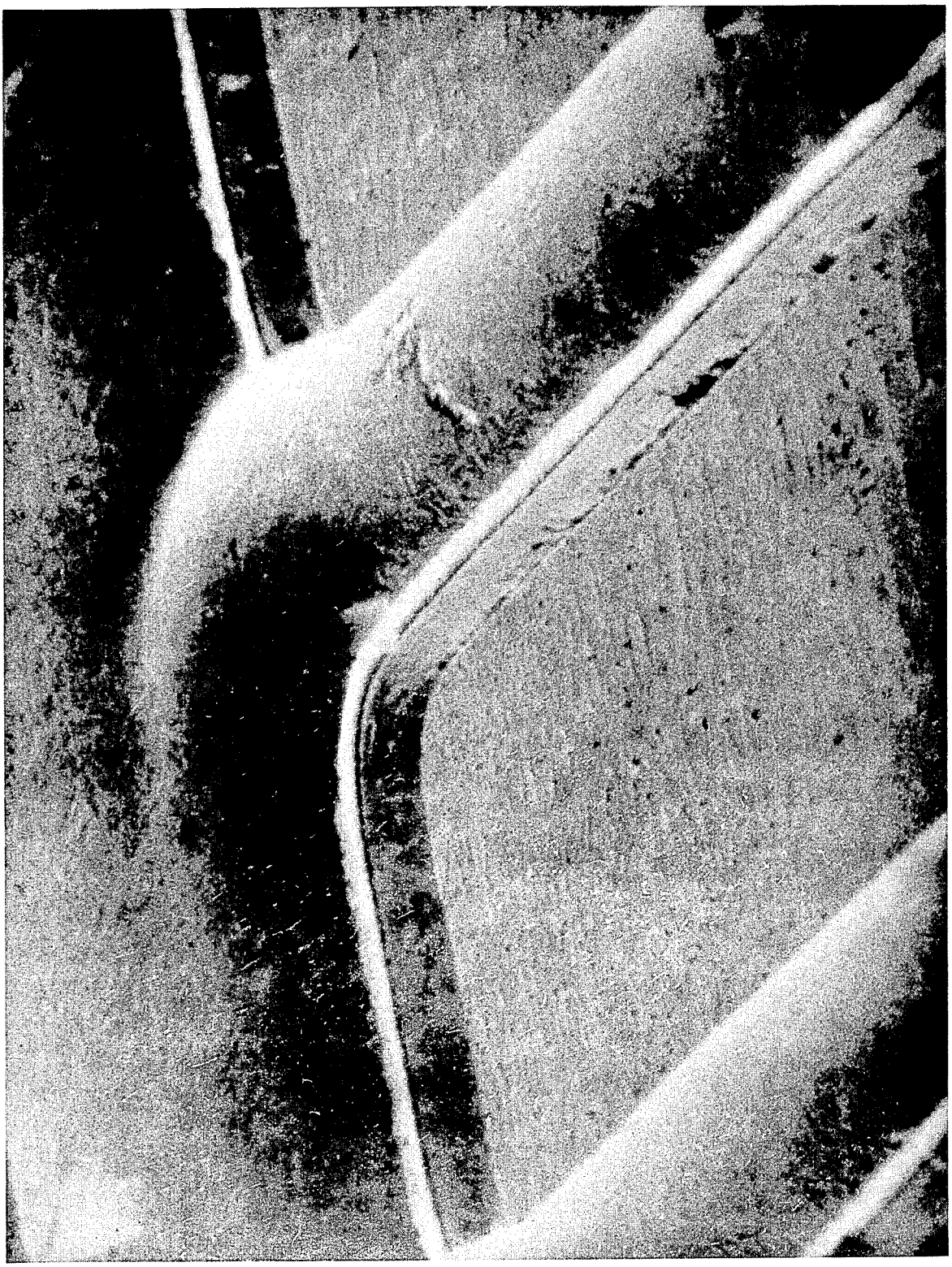
FIG. 10 is a photomicrograph showing the nearly vertical edges of the etched grooves of the metallic foil produced by the method of this invention.

FIG. 8 illustrates the I-V characteristic for the process of this invention. The curve 60 represents the condition where the bath is in a still condition. The system utilizes a stainless steel cathode and an electrolyte made from orthophosphoric acid and ethyl-alcohol in a proportion of 3 to 1 with an anode/cathode distance of 5 mm. Under these conditions, the electropolishing conditions occur between the points identified on the curve 60 by the letters C and D and illustrate Jacquet's plateau. The curve 60 is thus representative of the I-V characteristics of cells. Between the points A and C, etching is taking place, but the viscous layer is not yet established. The zone around C on curve 60 is unstable. There exists a threshold shown by the letter D on curve 60 above which oxygen formation takes place at the anode surface, thus introducing discontinuities in the viscous layer. The current density is larger at the location of these discontinuities and the value of current density depends exclusively of the applied potential.

The curve 62 represents the I-V characteristics of the same cell with electrolytic flow. As in the curve 60, a Jacquet's plateau C', D' is apparent. However, the combination of electrolyte flow and gas in formation makes it easier to remove the viscous layer and the electrode is depolarized at a smaller potential than in curve 60, thus producing a slope D', E' in the curve 62 where the operating conditions of the process of the invention are located. This I-V curve 62 is also strongly associated to the cell characteristics.

It would be possible to have a larger current density than those shown. However, the current density is not only dependent upon the electrode reactions and the anode-cathode distance, but also upon the electrolytic bath, since the current is carried through the solution by ions whose number per cubic content is dependent upon the acid concentration, and which differ from each other in their mobility.

FIG. 8 thus graphically illustrates the operating characteristics of this invention in terms of the following parameters, as shown by the curve designated by the reference numeral 62. The potential applied between the anode and the cathode and the current density are higher than in the electrolytic polishing condition. The operating range is located above the point D' of curve 62 and is typically between 3 and 4.5 volts for the system described. Under these conditions, the current density is 10 times higher than in the case of electrolytic polishing. The viscous layer and the oxygen formation are continuously removed by a strong flow of electrolyte which is directed against the anode to be etched. As indicated, the purpose of this flow is to avoid the conduction of the viscous layer formation where the current density is diffusion limited.

The copper layer 22 (FIGS. 3–5) provides a thick layer of highly conductive material to the intermediate in order to obtain the same electrical conditions on the entire anode surface in terms of applied potential and current density. The purpose of the copper conductive layer is to maintain the electric field as constant as possible at the anode surface (the foil 20) when the attack goes through the foil and to introduce a low resitance electrode for the return current, thus keeping the applied emf constant and allowing a uniform attack over the surface of the foil. It has been observed that the current density at the anode surface is dependent on the electrical field at closed points and its value is further increased by locating the anode as close as possible from the cathode.

In a typical operating condition, where 100 resistors of a 30,000 Ω ohmic value (or 103 kΩ/cm$^2$) were processed on a surface of 6.25 by 6.25 cm$^2$, the total amount of coulombs necessary to achieve a good etching is 280 for a total surface to be etched away of 6 cm$^2$ (25,000 lines, each 0.5 cm long and 5 microns wide). The optimum potential was found to be 3.80 volts and the current density 0.5 A/cm$^2$. The surface was uniformly etched away and the yield of the operation in terms of the number of acceptable resistors was around 95 to 97%.

After the electromachining operation, the foil is removed from its glass substrate, the photoresist is dissolved by appropriate means, and the foil is bonded on its final insulated substrate 12 with the etched surface above the substrate. The layer 24 of copper is then dissolved with a differential chemical etching process as is known in the art and the resistor is protected by an epoxy layer. These latter steps are within the skill of the art.

This invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. A process for producing a resistor from a thin film or foil of an electrically conducting resistive alloy comprising the steps of:
    bonding said thin film or foil to a relatively thick layer of an electrically conductive material;
    securing the combination of said bonded film or foil and said material to a carrier substrate;
    securing an insulating mask to an exposed surface of said film or foil, said mask having a pattern of open portions and shaped boundaries;
    electrolytically attacking said masked resistive alloy in an electrolytic cell under electromachining conditions to remove the exposed portions of said resistive film or foil; and
    securing said foil after electrolytic attack to a substrate, whereby a precision resistor is formed.

2. The process as set forth in claim 1 wherein the step of securing is performed after said foil or film is removed from said carrier substrate, and said mask has been removed.

3. The process as set forth in claim 2 further including the step of dissolving said relatively thick layer of said conductive material and further including the step of protecting said film or foil on said substrate by a layer of protective material.

4. The process as set forth in claim 1 wherein the step of electrolytically attacking said masked resistive alloy is further characterized in that the anode polarization in said cell is maintained substantially constant over the surface of the film or foil at least in significant part by the presence of said relatively thick layer of said conductive material.

5. The process as set forth in claim 4 wherein the step of electrolytically attacking said masked resistive film or foil is characterized in that the ionic current density is significantly independent of the applied potential in said cell.

6. The process as set forth in claim 5 wherein the step of electrolytically attacking said masked resistive film or foil is further characterized in that a continuous flow of electrolyte is maintained in said cell.

7. The process as set forth in claim 6 wherein the step of electrolytically attacking said masked resistive film or foil is further characterized in that the applied potential, for a given electrolyte velocity and flow rate on the anode in the cell, or mechanical vibration amplitude, or both, is such that the rate of formation of a viscous layer and oxygen at the anode is equal to their rate of removal.

8. The process as set forth in claim 7 wherein said resistive alloy predominantly comprises an alloy of nickel and chromium, said electrolyte is orthophosphoric acid and alcohol in a proportion of about 3:1, said applied potential is in excess of about 2.0 volts, the anode to cathode distance is about 5 mm, said electrolyte velocity is about 1 meter/sec, and said flow rate is about 1 liter/sec.

9. The process as set forth in claim 8 wherein said applied potential is preferably in the range between about 3.5 and about 4.5 volts.

10. A resistor made by the process of claim 1.
11. A resistor made by the process of claim 8.
12. A resistor made by the process of claim 9.
13. A resistor made by the process as set forth in claim 7.

* * * * *